United States Patent
Yoon et al.

(10) Patent No.: US 7,701,276 B2
(45) Date of Patent: Apr. 20, 2010

(54) MULTI-PHASE NEGATIVE DELAY PULSE GENERATOR

(75) Inventors: Sang Sic Yoon, Gyeonggi-do (KR); Keun Soo Song, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/964,404

(22) Filed: Dec. 26, 2007

(65) Prior Publication Data
US 2009/0134926 A1    May 28, 2009

(30) Foreign Application Priority Data
Nov. 23, 2007    (KR) .................... 10-2007-0120437

(51) Int. Cl.
*G06F 1/04*    (2006.01)
(52) U.S. Cl. ......................................... 327/295; 331/57
(58) Field of Classification Search ......... 327/291–293, 327/295, 296, 261, 263, 264, 269, 270, 272, 327/285, 288, 231, 232, 233, 237, 243, 245; 331/57
See application file for complete search history.

(56) References Cited

U.S. PATENT DOCUMENTS

| 5,428,317 A | * | 6/1995 | Sanchez et al. ............. 331/1 A |
| 5,475,344 A | * | 12/1995 | Maneatis et al. ............... 331/57 |
| 6,922,113 B2 | | 7/2005 | Mizuno et al. |
| 7,113,048 B2 | | 9/2006 | Brown et al. |
| 7,321,269 B2 | * | 1/2008 | Drake et al. ................... 331/57 |
| 2007/0018737 A1 | | 1/2007 | Drake et al. |

FOREIGN PATENT DOCUMENTS

JP    2001-177381 A    6/2001

* cited by examiner

*Primary Examiner*—Long Nguyen
*Assistant Examiner*—Sibin Chen
(74) *Attorney, Agent, or Firm*—Ladas & Parry LLP

(57) ABSTRACT

A multi-phase pulse generator provides an even number of pulse signals of same phase difference and pulse signals of higher frequency by applying a negative delay concept. The multi-phase pulse generator includes a first delay block with first unit blocks which have a first negative delay property respectively and of which an even number is ring-coupled; and a second delay block including second unit blocks which have a second negative delay property respectively and of which even number is ring-coupled. The number of the first unit block and the number of the second unit block are the same. A plurality of output nodes is formed based on one-to-one sharing between the first unit block and the second unit block having output signals of different level. Each output node outputs a pulse generated by racing the output signals of different level to each other which are provided from the first unit block and the second unit block connected to the each output node.

21 Claims, 5 Drawing Sheets

MULTI-PHASE NEGATIVE DELAY PULSE GENERATOR

CROSS-REFERENCE TO RELATED APPLICATIONS

The present application claims priority to Korean patent application number 10-2007-0120437 filed on Nov. 23, 2007, which is incorporated herein by reference in its entirety.

BACKGROUND OF THE INVENTION

The present invention relates to a multi-phase pulse generator, and more particularly to a multi-phase pulse generator applying a concept of negative delay.

A ring oscillator is a type of pulse generator used for a semiconductor device. The ring oscillator is a circuit that generates pulses having a uniform frequency. The pulse generator, such as the ring oscillator, is a basic circuit that can be used in various fields including a phase locked loop (PLL), a direct current to direct current converter (DC-DC converter), a counter, and a frequency synthesizer.

A pulse generator made of a generic single ring oscillator outputs pulse signals having a uniform frequency. A period of the pulse signal output from the pulse generator, i.e., the frequency, is determined by the delay time in each of the stages and the number of stages provided inside.

As semiconductor devices reach higher speeds, the pulse generators used in these devices require higher frequencies. For a higher frequency, the pulse generator applies the concept of negative delay.

FIG. 1 shows an example of a pulse generator applying the negative delay concept, in which block B1, B2, B3, B4, B5 of each stage has an inverter comprising the combination of a PMOS transistor and a NMOS transistor, and a negative delay (−D) is applied to the gate of the PMOS transistor in each block B1, B2, B3, B4, B5. In the pulse generator of FIG. 1, the PMOS transistor P1 and NMOS transistor N1 have a turn-on time different from each other by a negative delay −D. As a result, the frequency of the pulse signal outputted from a node ND1 is advantageously increased.

That is, when the output of the block (that is, ND1 in each block) transitions from low to high, the PMOS transistor P1 turns on earlier than the NMOS transistor N1, and when the output of the block transitions from high to low, the PMOS transistor P1 turns off earlier than the NMOS transistor N1.

The transition time needed to change the output level decreases, and the frequency of the output signal increases due to the negative delay. The negative delay is advantageous for increasing the frequency and generating an odd number of signals having the same phase at each node.

FIG. 2 shows one example of the pulse generator of FIG. 1 applying the negative delay concept. In FIG. 2, the combination of a PMOS transistor P2 and an NMOS transistor N2 is present in each of the unit blocks B11 to B15 at each of the stages that are looped, for example, from B11 to B12 to B13 to B14 to B15 then to B11 to form a loop. In this loop structure, each gate of the PMOS transistor P2 in a particular unit block receives an output signal from an output node ND2 of the unit block that precedes the receiving unit block by two stages in accordance with the negative delay concept (for example, P2 in B11 receives output node ND2 of B13, etc).

FIG. 1 and FIG. 2 show a single ring oscillator as an example of a pulse generator where the pulse generator includes an odd number of stages so that each node is not stable but oscillated, thereby generating an odd number of multi-phase pulses.

However, it is difficult to generate an odd number of multi-phase pulses by a pulse generator using a single ring oscillator.

The ring oscillator must have an even number of stages in order to obtain an even number of multi-phase pulses, but in this case as shown in FIGS. 1-2, the output between the blocks of the ring oscillator is stabilized and thus oscillation is not made.

Therefore, in order to generate an even number of multi-phase pulse signals, the prior art must further include a flip-flop block such as a counter, in addition to the pulse generator generating an odd number of signals as shown in FIG. 1 and FIG. 2.

However, if an additional unit such as a flip-flop block is included in a single ring oscillator, it will cause a problem due to the lowering of the frequency of the pulse signal generated by the pulse generator.

SUMMARY OF THE INVENTION

The present invention provides a multi-phase negative delay pulse generator that generates an even number of pulse signals having same phase difference.

The present invention provides a multi-phase pulse generator that is allowed to obtain multi-phase pulse signals by racing signals outputted from the dual oscillator with a symmetrical negative delay.

A multi-phase pulse generator according to the present invention comprises a first delay block including an even number of ring-coupled first unit blocks having a first negative delay property; and a second delay block including an even number of ring-coupled second unit blocks having a second negative delay property, wherein the number of the first unit block and the number of the second unit blocks are the same, such that each first unit block is paired with one of the second unit blocks in one-to-one sharing, wherein an output signal of each of the first and second unit blocks of each pair is connected to each other forming an output node to which the output signal of each of the first and second unit blocks of each pair is a different level, and wherein each output node outputs a pulse signal generated by racing the different levels of output signals from the paired first and second unit blocks.

Preferably, the first unit block and the second unit block comprise an inverter in which pull-up PMOS transistor and pull-down NMOS transistor are coupled.

Preferably, the first unit block causes an output from a previous first unit block to be applied to a gate of the PMOS transistor of the first unit block in order to implement the first negative delay property, and the second unit block causes an output from a previous second unit block to be applied to a gate of the NMOS transistor of the second unit block in order to implement the second negative delay property, Further, the first unit block and the second unit block allow an output from the unit block preceding by the same even number of stages to be applied to itself respectively.

Further, the first unit block and the second unit block cause an output from the unit block preceding by an even number of stages different to each other to be applied to itself respectively.

Further, each of the pulse signals outputted from the plurality of output nodes has the same phase difference to each other by dividing by one period.

More preferably, the first delay block and the second delay block include four first unit blocks and four second unit blocks respectively, and the first unit blocks and the second unit blocks cause an output from the second preceding first unit block and the second preceding second unit block to be applied to itself in order to implement the first negative delay and the second negative delay respectively.

Further, the first delay block and the second delay block include eight first unit blocks and eight second unit blocks respectively, and the first unit blocks and the second unit blocks cause an output from the fourth preceding first unit block and the fourth preceding second unit block to be applied to itself in order to implement the first negative delay and the second negative delay respectively.

Further, the first delay block and the second delay block include eight first unit blocks and eight second unit blocks respectively, the first unit block causes an output from the first unit block preceding by an even number of unit blocks to be applied to itself in order to implement the first negative delay, and the second unit block causes an output from the second unit block preceding by an even number of unit blocks with respect to the first unit block to be applied to itself in order to implement the second negative delay.

Further, the first delay block and the second delay block include eight first unit blocks and eight second unit blocks respectively, the first unit block causes an output from the first unit block preceding by an even number of unit blocks to be applied to itself in order to implement the first negative delay, and the second unit block causes an output from the second unit block following by an even number of unit blocks with respect to the first unit block to be applied to itself in order to implement the second negative delay Further, the first delay block and the second delay block include sixteen first unit blocks and sixteen second unit blocks respectively, and the first unit block and the second unit block cause an output from the fourth preceding first unit block and the fourth preceding second unit block to be applied to itself in order to implement the first negative delay and the second negative delay respectively.

Further, the first delay block and the second delay block include sixteen first unit blocks and sixteen second unit blocks respectively, the first unit block causes an output from the first unit block preceding by an even number of unit blocks to be applied to itself in order to implement the first negative delay, and the second unit block causes an output from the second unit block preceding by an even number of unit blocks with respect to the first unit block to be applied to itself in order to implement the second negative delay.

Further, the first delay block and the second delay block include sixteen first unit blocks and sixteen second unit blocks respectively, the first unit block causes an output from the first unit block preceding by an even number of unit blocks to be applied to itself in order to implement the first negative delay, and the second unit block causes an output from the second unit block following by an even number of unit blocks with respect to the first unit block to be applied to itself in order to implement the second negative delay A multi-phase pulse generator according to the present invention comprises a ring-coupled first inverter chain having an even number of inverters; and a ring-coupled second inverter chain having an even number of inverters, wherein the number of inverters included in the first inverter chain and the number of inverter included in the second inverter chain are the same such that each inverter of the first inverter chain is paired with one inverter of the second inverter chain in one-to-one sharing, wherein an output signal of each inverter of the first and second inverter chain pair is connected to each other forming an output node to which the output signal of each inverter of the first and second inverter chain pair is a different level based, and wherein each output node outputs a pulse signal generated by racing the different levels of output signals from the paired inverters of the first and second inverter chains.

Preferably, the first inverter chain and the second inverter chain include four inverters respectively, the inverter of the first inverter chain allows an output from second preceding inverter preceding to be feedback for the purpose of pull-up drive and the inverter of the second inverter chain allows an output from the second preceding inverter to be feedback for the purpose of pull-down drive.

Further, the first inverter chain and the second inverter chain include eight inverters respectively, the inverter of the first inverter chain allows an output from the inverter preceding by an even number of inverters of the first inverter chain to be feedback for the purpose of pull-up drive, and the inverter of the second inverter chain allows an output from the inverter preceding by an even number of inverters of the second inverter chain to be feedback for the purpose of pull-down drive.

Further, the first inverter chain and the second inverter chain include eight inverters respectively, the inverter of the first inverter chain allows an output the other inverter preceding by an even number of inverters of the first inverter chain to be feedback for the purpose of pull-up drive, and the inverter of the second inverter chain allows an output from the inverter preceding by an even number of inverters of the second inverter chain with respect to feedback for the pull-up drive of the first inverter chain to be feedback for the purpose of pull-down drive.

Further, the first inverter chain and the second inverter chain include eight inverters respectively, the inverter of the first inverter chain allows an output from the inverter preceding by an even number of inverters of the first inverter chain to be feedback for the purpose of pull-up drive, and the inverter of the second inverter chain allows an output from the inverter following by an even number of inverters of the second inverter chain with respect to feedback for the pull-up drive of the first inverter chain to be feedback for the purpose of pull-down drive.

Further, the first inverter chain and the second inverter chain include sixteen inverters respectively, the inverter of the first inverter chain allows an output from the inverter preceding by an even number of inverters of the first inverter chain to be feedback for the purpose of pull-up drive, and the inverter of the second inverter chain allows an output from the inverter preceding by an even number of inverters of the second inverter chain to be feedback for the purpose of pull-down drive.

Further, the first inverter chain and the second inverter chain include sixteen inverters respectively, the inverter of the first inverter chain allows an output from the inverter preceding by an even number of inverters of the first inverter chain to be feedback for the purpose of pull-up drive, and the inverter of the second inverter chain allows an output from the inverter preceding by an even number of inverters of the second inverter chain with respect to feedback for pull-up drive of the first inverter chain to be feedback for the purpose of pull-down drive.

Further, the first inverter chain and the second inverter chain include sixteen inverters respectively, the inverter of the first inverter chain allows an output from the inverter preceding by an even number of inverters of the first inverter chain to be feedback for the purpose of pull-up drive, and the inverter of the second inverter chain allows an output from the inverter following by an even number of inverters of the second inverter chain with respect to feedback for pull-up drive of the first inverter to be feedback for the purpose of pull-down drive.

According to the present invention, it is possible to provide an even number of pulse signals having the same phase difference.

DESCRIPTION OF SPECIFIC EMBODIMENTS

Hereinafter, preferred embodiments of the present invention will be described in detail with reference to the accompanying drawings.

A multi-phase pulse generator according to the present invention comprises a dual ring oscillator in which blocks are comprised of an even number of stages. The multi-phase pulse generator generates an even number of multi-phase pulse signals by sharing between nodes having a different output level and racing the outputs from the nodes.

Figure 1:
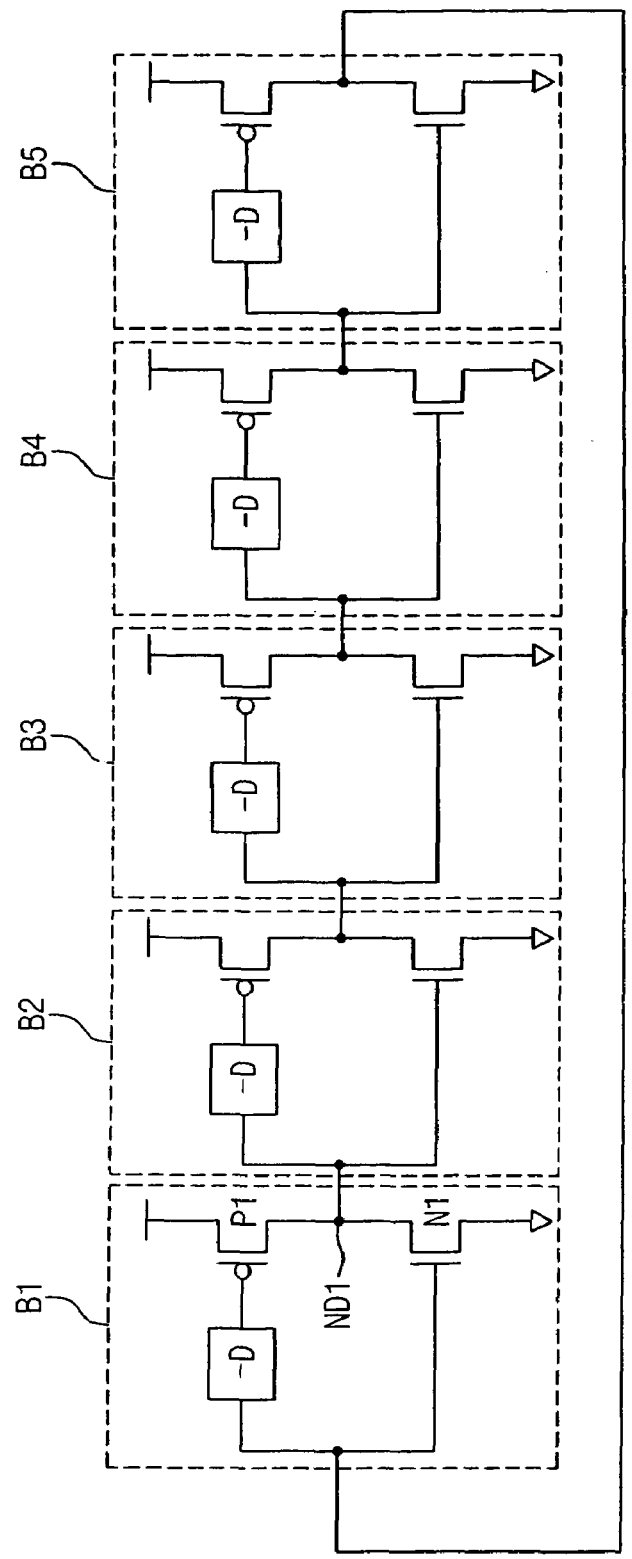
FIG. 1 is a circuit diagram for showing a negative delay concept of applying a negative delay to a conventional pulse generator.
Figure 2:
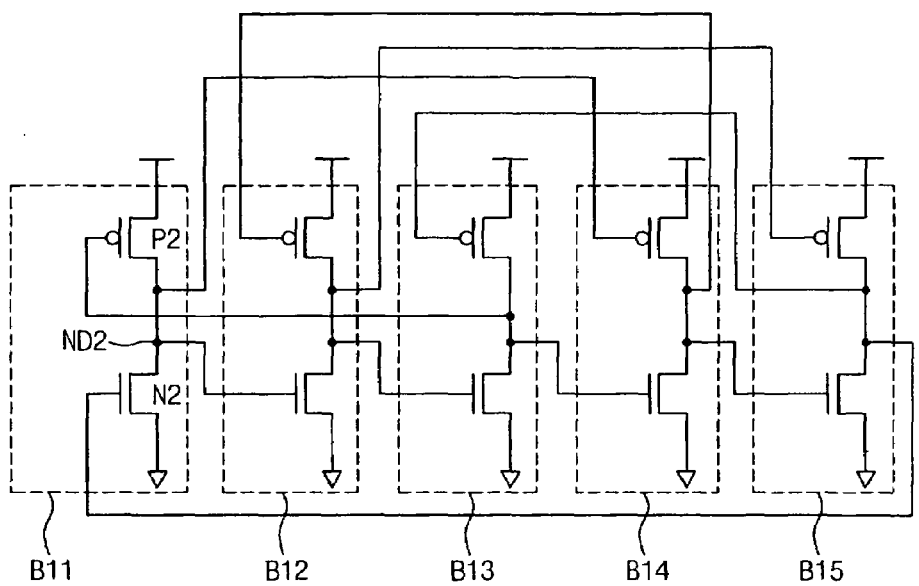
FIG. 2 is a circuit diagram showing a ring oscillator with application the negative delay of FIG. 1.
Figure 3:
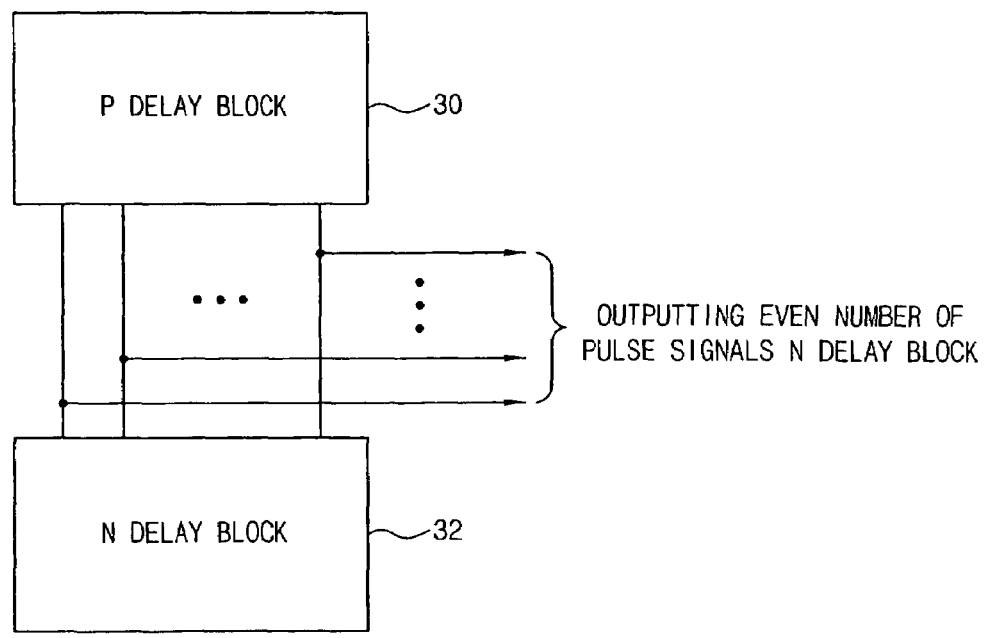
FIG. 3 is a block diagram showing a multi-phase pulse generator according to an embodiment of the present invention.

Referring to FIG. 3, an embodiment according to the present invention includes a P delay block 30 and an N delay block 32 in which the P delay block 30 and the N delay block 32 have an even number of outputs that are coupled based on one-to-one sharing.

Herein, the P delay block 30 includes an even number of delay elements and provides an output for each of the delay elements. For example, a single oscillator comprising an even number of inverters can be presented. The P delay block 30 allows the negative delay to be applied to the PMOS transistor from the preceding PMOS and NMOS transistor thereby constituting the inverter.

In addition, the N delay block 32 includes an even number of delay elements and provides an output for each of the delay elements. For example, a single oscillator comprising an even number of inverters can be presented. The N delay block 32 allows the negative delay to be applied to the NMOS transistor from the preceding PMOS and NMOS transistor thereby constituting the inverter.

Further, the P delay block 30 and the N delay block 32 can constitute a single oscillator respectively. As a result, they can constitute a dual oscillator together.

The above P delay block 30 and N delay block 32 include the same number of delay elements, apply the negative delay symmetrical to each other, and share an output with elements having an output different from each other. Therefore, the P delay block 30 and the N delay block 32 can output an even number of pulse signals from an even number of output nodes shared between them. These pulse signals can have the same phase difference with each other.

Figure 4:
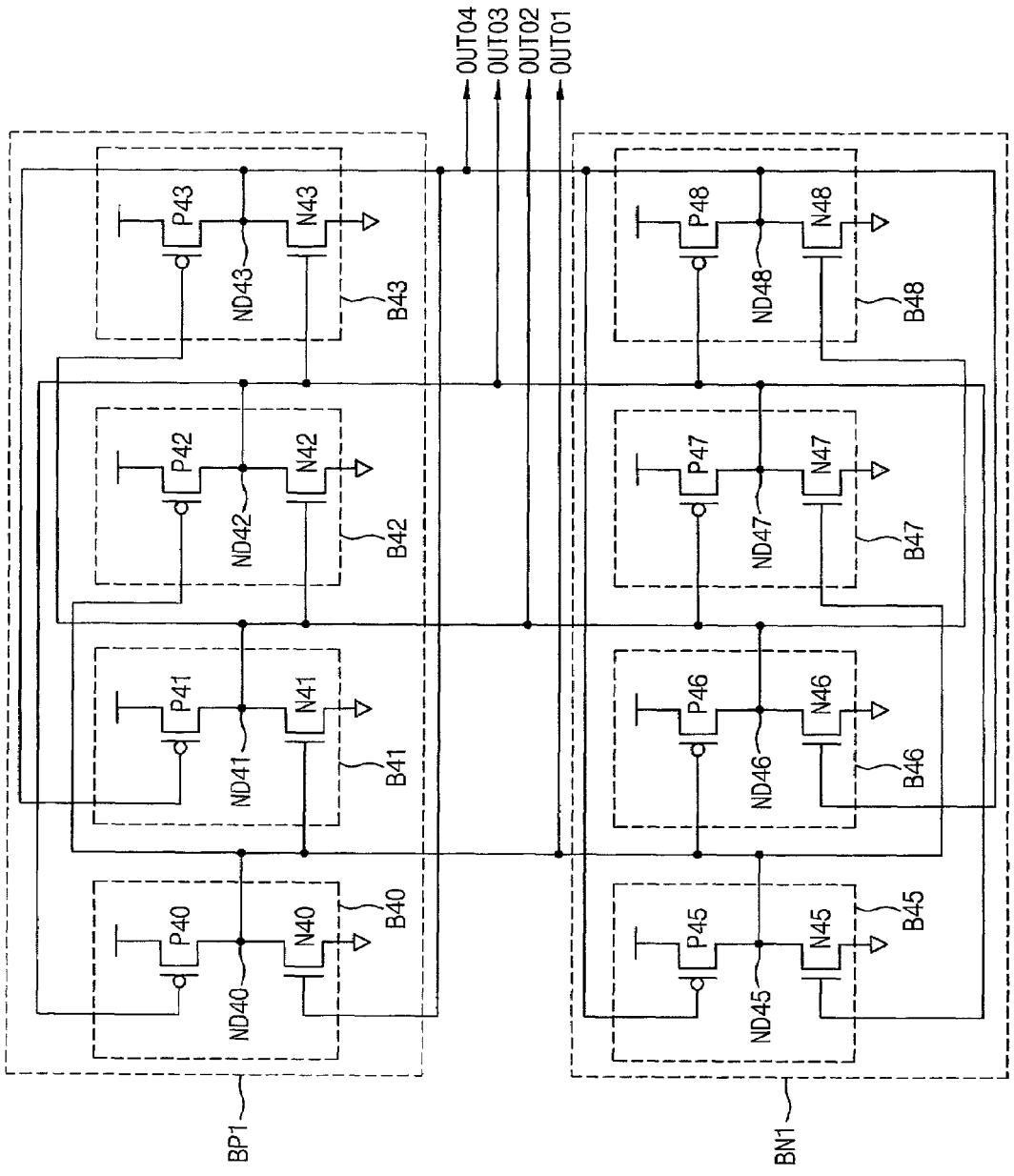
FIG. 4 is a circuit diagram illustrating four multi-phase pulse signals that are outputted according to an embodiment of the present invention.
Figure 5:
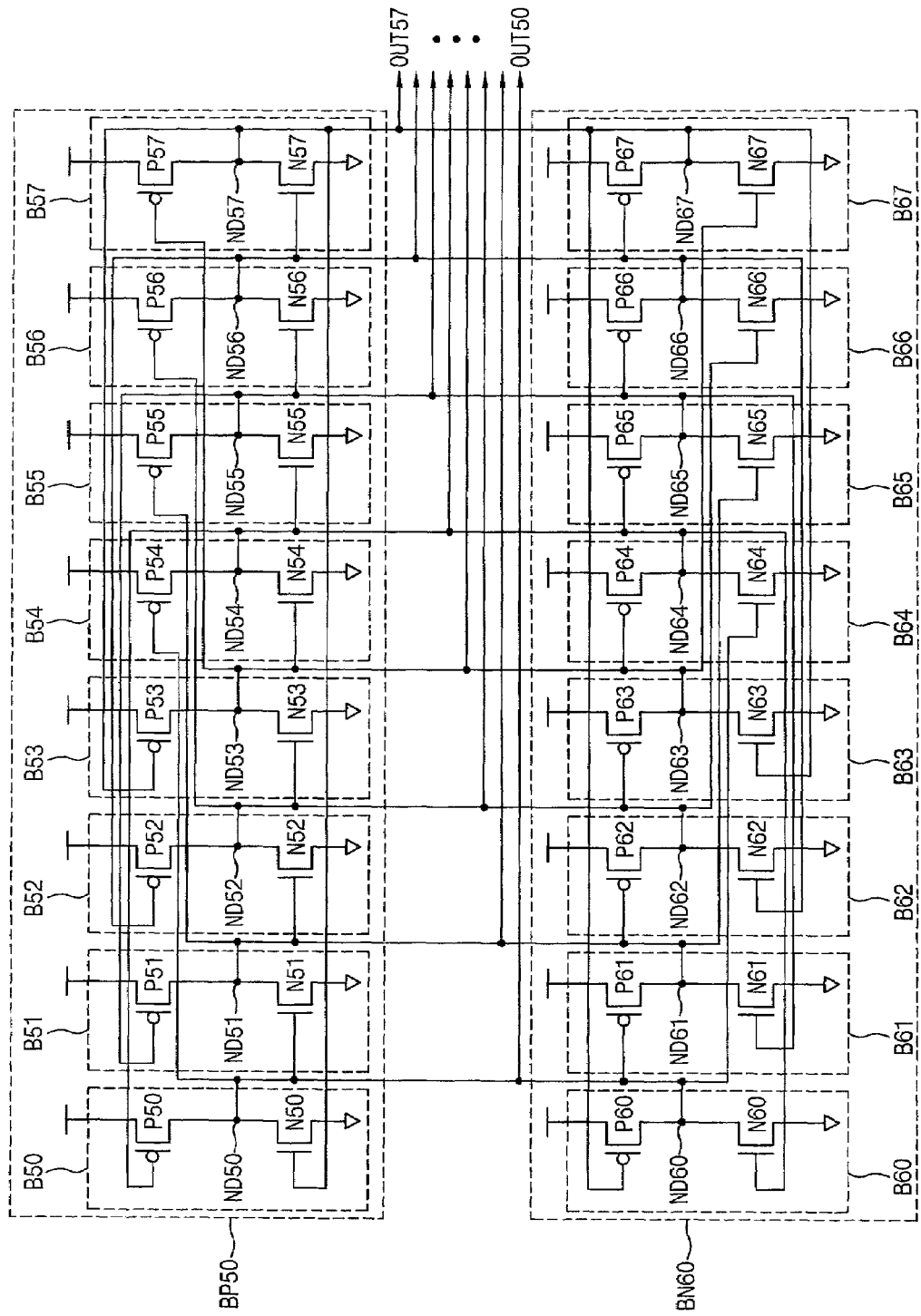
FIG. 5 is a circuit diagram illustrating eight multi-phase pulse signals that are outputted according to another embodiment of the present invention.

More specifically, an embodiment of FIG. 3 is such that the P delay block 30 accomplishes a first negative delay with a first delay block including an even number of first unit blocks ring-coupled together, as shown in FIG. 4 and FIG. 5. The N delay block 32 accomplishes a second negative delay with a second delay block including an even number of second unit blocks ring-coupled together, as also shown in FIG. 4 and FIG. 5.

Herein, the number of first unit blocks and second unit blocks included in the P delay block 30 and the N delay block 32 respectively are the same. The first and second unit blocks having different output levels to each other are coupled based on a one-to-one sharing, thereby forming a plurality of output nodes. Each of the output nodes outputs a pulse signal generated by racing the output signals of different levels provided from the first unit block and the second unit block coupled to each other.

FIG. 4 illustrates a P delay block BP1 and N delay block BN1 including four delay elements respectively.

In FIG. 4, the P delay block BP1 includes four delay elements, i.e., unit blocks B40, B41, B42, B43. Each of the unit blocks B40, B41, B42, B43 are composed of PMOS transistors P40, P41, P42, P43 and NMOS transistors N40, N41, N42, N43 constituting the inverter respectively, and output nodes ND40, ND41, ND42, ND43 which are formed between the PMOS transistors P40, P41, P42, P43 and the NMOS transistors N40, N41, N42, N43. The output node (ND40~ND43) of the preceding unit block is connected to a gate of each of the NMOS transistor N40, N41, N42, N43. The output node (ND40~ND43) of the second preceding unit block is connected to a gate of each of the PMOS transistors P40, P41, P42, P43. The P delay block BP1 implements the negative delay by connecting the output node of the second preceding unit block to the gate of the PMOS transistor as mentioned above.

In addition, the N delay block BN1 includes four delay elements, i.e., unit blocks B45 B46, B47, B48. Each of unit the blocks B45, B46, B47, B48 are composed of PMOS transistors P45, P46, P47, P48 and NMOS transistors N45, N46, N47, N48 constituting the inverter respectively, and output nodes ND45, ND46, ND47, ND48 which are formed between the PMOS transistors P45, P46, P47, P48 and the NMOS transistors N45, N46, N47, N48. The output node (ND45~ND48) of the preceding unit block is connected to a gate of each of the PMOS transistor P45, P46, P47, P48. The output node (ND45~ND48) of second preceding unit block is connected to a gate of each of the NMOS transistor N45, N46, N47, N48. The N delay block BN1 implements the negative delay by connecting the output node of the second preceding unit block to the gate of the NMOS transistor as mentioned above.

Each of the output nodes in the P delay block BP1 and the N delay block BN1 correspond one-to-one. That is, the output nodes ND40 and ND45, the output nodes ND41 and ND46, the output nodes ND42 and ND47, and the output nodes ND43 and ND48 are connected in common with each other. The pulse signals OUT01, OUT02, OUT03, and OUT04 are outputted via the connected common nodes.

According to the structure mentioned above, the negative delay is applied to the PMOS transistor P40, P41, P42, and P43 of the P delay block BP1 and the NMOS transistor N40, N41, N42 and N43 of the N delay block BN1.

The P delay block BP1 and the N delay block BN1 allow a level at each node to be stabilized and thus do not have any oscillating elements. Therefore, each of the output nodes in the P delay block BP1 and the N delay block BN1, having a symmetrical negative delay to each other, is coupled based on a one-to-one sharing. The racing is caused by a signal difference between the output nodes ND40~ND43 of the P delay block BP1 and the output nodes ND45~ND48 of the N delay block BN1 at each of the shared output nodes. This allows unstable signals to be generated inducing oscillation and outputting the pulse signal.

Considering that the period of the 4 output signals is M, the phase difference between the 4 signals is M/4. The signal of one period is outputted by putting together all 4 phase differences.

Although the embodiment of FIG. 4 is an example of generating four multi-phase pulse signals, the present invention can also be implemented to generate eight or sixteen multi-phase pulse signals.

FIG. 5 is a circuit diagram showing an embodiment generating eight multi-phase pulse signals in which the P delay block BP50 and the N delay block BN60 include eight delay elements respectively.

In FIG. 5, the P delay block BP50 includes 8 delay elements, i.e., unit blocks B50, B51, B52, B53, B54, B55, B56, B57. Each of the unit blocks B50, B51, B52, B53, B54, B55, B56, B57 are composed of PMOS transistors P50, P51, P52, P53, P54, P55, P56, P57 and NMOS transistors N50, N51, N52, N53, N54, N55, N56, N57 constituting the inverter respectively, and output nodes ND50, ND51, ND52, ND53, ND54, ND55, ND56, ND57 which are formed between the PMOS transistors P50, P51, P52, P53, P54, P55, P56, P57 and NMOS transistors N50, N51, N52, N53, N54, N55, N56, N57. The output node (ND50~ND57) of the preceding unit block is connected to the gate of each of NMOS transistor N50, N51, N52, N53, N54, N55, N56, N57. The output node (ND50~ND57) of the fourth preceding unit block is connected to the gate of each of the PMOS transistors P50, P51, P52, P53, P54, P55, P56, P57. The P delay block BP50 implements the negative delay by connecting the output node of the fourth preceding unit block to the gate of the PMOS transistor as mentioned above.

In addition, the N delay block BN60 includes 8 delay elements, i.e., unit blocks B60, B61, B62, B63, B64, B65, B66, B67. Each of the unit blocks B60, B61, B62, B63, B64, B65, B66, B67 are composed of PMOS transistors P60, P61, P62, P63, P64, P65, P66, P67 and NMOS transistors N60, N61, N62, N63, N64, N65, N66, N67 constituting inverter respectively, and output nodes ND60, ND61, ND62, ND63, ND64, ND65, ND66, ND67 which are formed between the PMOS transistors P60, P61, P62, P63, P64, P65, P66, P67 and NMOS transistors N60, N61, N62, N63, N64, N65, N66, N67. The output node (ND60~ND67) of the preceding unit block is connected to the gate of each of the PMOS transistor P60, P61, P62, P63, P64, P65, P66, P67. The output node (ND60~ND67) of the fourth preceding unit block is connected to the gate of each of the NMOS transistors N60, N61, N62, N63, N64, N65, N66, P57. The N delay block BN60 implements the negative delay by connecting the output node of the fourth preceding unit block to the gate of the NMOS transistor as mentioned above.

Each of the output nodes of the P delay block BP60 and the N delay block BN60 correspond one-to-one. That is, the output nodes ND50 and ND60, the output node ND51 and ND61, the output nodes ND52 and ND62, the output nodes ND53 and ND63, the output nodes ND54 and ND64, the output node ND55 and ND65, the output nodes ND56 and ND66, and the output nodes ND57 and ND67 are connected in common with each other. The pulse signals OUT50, OUT51, OUT52, OUT53, OUT54, OUT55, OUT56, OUT57 are outputted via the connected common nodes.

According to the structure mentioned above, the negative delay is applied to the PMOS transistor P50, P51, P52, P54, P55, P56, P57 of the P delay block BP50 and the NMOS transistor N60, N61, N62, N63, N64, N65, N66, N67 of the N delay block BN60.

In the embodiment of FIG. 5 similarly as described in FIG. 4, the racing is caused by a signal difference between the output nodes ND50~ND57 of the P delay block BP50 and the output nodes ND60~ND67 of the N delay block BN60 at each of the shared output nodes. This allows unstable signals to be generated inducing oscillation and outputting the pulse signal.

Considering that the period of 8 output signals is M, the phase difference of 8 signals is M/8. The signal of one period is outputted by putting together all 8 phase differences.

Further, according to the present invention, the frequency lowers further as the number of delay elements, i.e. inverters, increases. Therefore, any one block of the P delay block BP70 and the N delay block BN80 can implement the negative feedback using the output from the second preceding unit block and the other delay block can implement the negative feedback using the output from the fourth preceding unit block. In this case, it is possible to obtain a pulse frequency that is approximately twice as high.

Figure 6:
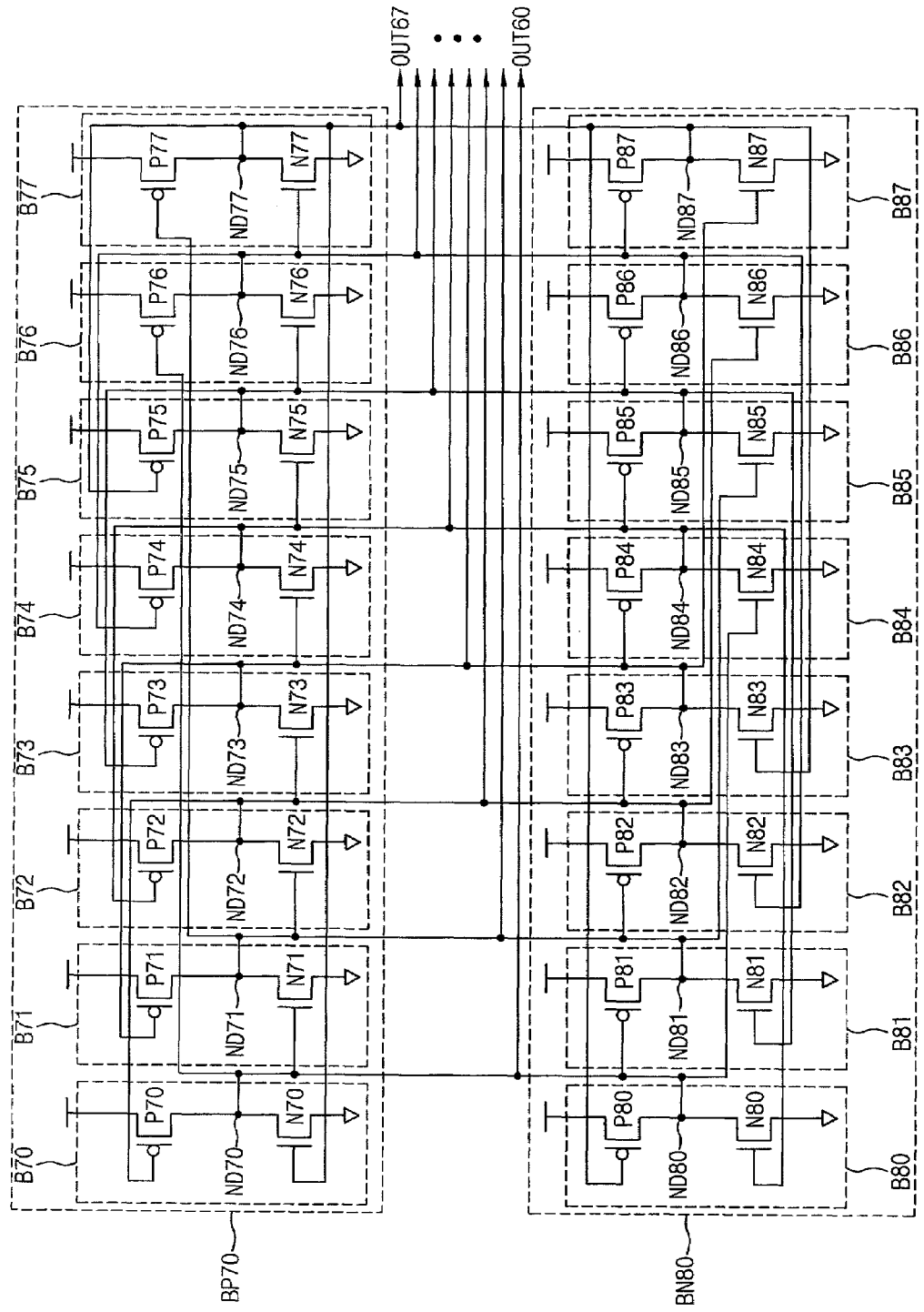
FIG. 6 is a circuit diagram illustrating eight multi-phase pulse signals that are outputted with a higher frequency than that of the embodiment of FIG. 5 according to still another embodiment of the present invention.

The embodiment of FIG. 6 includes a P delay block BP70 and an N delay block BN80. P delay block BP70 includes unit blocks B70~B77 comprised of PMOS transistors P70~P77 and NMOS transistors N70~N77 constituting inverters respectively. N delay block BN70 includes unit blocks B80~B87 comprised of PMOS transistors P80~P87 and NMOS transistors N80~N87 constituting inverters respectively. Output nodes ND70~ND77 are formed in the unit blocks B70~B77 and output nodes ND80~ND87 are formed in the unit blocks B80~B87.

As described in the above-mentioned embodiments, the present invention can provide an even number of pulse signals having the same phase difference and provide pulse signals of higher frequency by applying a negative delay concept.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A multi-phase pulse generator, comprising:
a first delay block including an even number of ring-coupled first unit blocks having a first negative delay property; and
a second delay block including an even number of ring-coupled second unit blocks having a second negative delay property,
wherein the number of the first unit blocks and the number of the second unit blocks are the same such that each first unit block is paired with one of the second unit blocks in one-to-one sharing,
wherein an output signal of each of the first and second unit blocks is connected to each other forming an output node to which the output signal of each of the first and second unit blocks of each pair is a different level, and wherein each output node outputs a pulse signal generated by racing the different levels of output signals from the paired first and second unit blocks.

2. The multi-phase pulse generator as set forth in claim 1, wherein each of the first unit blocks and the second unit blocks comprises an inverter comprising a pull-up PMOS transistor and a pull-down NMOS transistor.

3. The multi-phase pulse generator as set forth in claim 2, wherein each of the first unit blocks applies an output from a previous first unit block to a gate of the PMOS transistor of the first unit block to implement the first negative delay property, and each of the second unit blocks applies an output from a previous second unit block to a gate of the NMOS transistor of the second unit block to implement the second negative delay property.

4. The multi-phase pulse generator as set forth in claim 3, wherein each of the first unit blocks and each of the second unit blocks applies an output to itself from the unit block preceding by the same even number of units blocks.

5. The multi-phase pulse generator as set forth in claim 3, wherein each of the first unit blocks and each of the second unit blocks applies an output to itself from the unit block preceding by an even number of unit blocks different from each of the first unit blocks and second unit blocks respectively.

6. The multi-phase pulse generator as set forth in claim 1, wherein each of the pulse signals outputted from the plurality of output nodes has the same phase difference to each other by dividing by one period.

7. The multi-phase pulse generator as set forth in claim 1, wherein the first delay block comprises four first unit blocks and the second delay block comprises four second unit blocks, and each of the first unit blocks applies an output to itself from the second preceding first unit block and each of the second unit blocks applies an output to itself from the second preceding second unit block to implement the first negative delay and the second negative delay respectively.

8. The multi-phase pulse generator as set forth in claim 1, wherein the first delay block comprises eight first unit blocks and the second delay block comprises eight second unit blocks, and each of the first unit blocks applies an output to itself from the fourth preceding first unit block and each of the second unit blocks applies an output to itself from the fourth preceding second unit block to implement the first negative delay and the second negative delay respectively.

9. The multi-phase pulse generator as set forth in claim 1, wherein the first delay block comprises eight first unit blocks and the second delay block comprises eight second unit blocks, wherein each of the first unit blocks applies an output to itself from the first unit block preceding by an even number of unit blocks to implement the first negative delay, and each of the second unit blocks applies an output to itself from the second unit block preceding by an even number of unit blocks with respect to the first unit block to implement the second negative delay.

10. The multi-phase pulse generator as set forth in claim 1, wherein the first delay block comprises eight first unit blocks and the second delay block comprises eight second unit blocks, wherein each of the first unit blocks applies an output to itself from the first unit block preceding by an even number of unit blocks to implement the first negative delay, and each of the second unit blocks applies an output to itself from the second unit block following by an even number of unit blocks with respect to the first unit block to implement the second negative delay.

11. The multi-phase pulse generator as set forth in claim 1, wherein the first delay block comprises sixteen first unit blocks and the second delay block comprises sixteen second unit blocks, and each of the first unit blocks applies an output to itself from the fourth preceding first unit block and each of the second unit blocks applies an output to itself from the fourth preceding second unit block to implement the first negative delay and the second negative delay respectively.

12. The multi-phase pulse generator as set forth in claim 1, wherein the first delay block comprises sixteen first unit blocks and the second delay block comprises sixteen second unit blocks, wherein each of the first unit blocks applies an output to itself from the first unit block preceding by an even number of unit blocks to implement the first negative delay, and each of the second unit blocks applies an output to itself from the second unit block preceding by an even number of unit blocks with respect to the first unit block to implement the second negative delay.

13. The multi-phase pulse generator as set forth in claim 1, wherein the first delay block comprises sixteen first unit blocks and the second delay block comprises sixteen second unit blocks, wherein each of the first unit blocks applies an output to itself from the first unit block preceding by an even number of unit blocks to implement the first negative delay, and each of the second unit blocks applies an output to itself from the second unit block following by an even number of unit blocks with respect to the first unit block to implement the second negative delay.

14. A multi-phase pulse generator, comprising
a ring-coupled first inverter chain having an even number of inverters; and
a ring-coupled second inverter chain having an even number of inverters,
wherein the number of inverters included in the first inverter chain and the number of inverters included in the second inverter chain are the same such that each inverter of the first inverter chain is paired with one inverter of the second inverter chain in one-to-one sharing,
wherein an output signal of each inverter of the first and second inverter chain pair is connected to each other forming an output node to which the output signal of each inverter of the first and second inverter chain pair is a different level, and
wherein each output node outputs a pulse signal generated by racing the different levels of output signals from the paired inverters of the first and second inverter chains.

15. The multi-phase pulse generator as set forth in claim 14, wherein the first inverter chain and the second inverter chain comprise four inverters respectively, and each of the inverters of the first inverter chain applies an output from the second preceding inverter as feedback for the purpose of pull-up drive and each of the inverters of the second inverter chain applies an output from the second preceding inverter as feedback for the purpose of pull-down drive.

16. The multi-phase pulse generator as set forth in claim 14, wherein the first inverter chain and the second inverter chain comprise eight inverters respectively, and each of the inverters of the first inverter chain applies an output from the inverter preceding by an even number of inverters of the first inverter chain as feedback for the purpose of pull-up drive and the each of the inverters of the second inverter chain applies an output from the inverter preceding by an even number of inverters of the first inverter chain as feedback for the purpose of pull-down drive.

17. The multi-phase pulse generator as set forth in claim 14, wherein the first inverter chain and the second inverter chain comprise eight inverters respectively, and each of the inverters of the first inverter chain applies an output from the inverter preceding by an even number of inverters of the first inverter chain as feedback for the purpose of pull-up drive and the each of the inverters of the second inverter chain applies an output from the inverter preceding by an even number of inverters of the second inverter chain with respect to the feedback for the pull-up drive of the first inverter chain as feedback for the purpose of pull-down drive.

18. The multi-phase pulse generator as set forth in claim 14, wherein the first inverter chain and the second inverter chain comprise eight inverters respectively, and each of the inverters of the first inverter chain applies an output from the inverter preceding by an even number of inverters of the first inverter chain as feedback for the purpose of pull-up drive and each of the inverters of the second inverter chain applies an output from the inverter following by an even number of inverters of the second inverter chain with respect to the feedback for the pull-up drive of the first inverter chain to be feedback for the purpose of pull-down drive.

19. The multi-phase pulse generator as set forth in claim 14, wherein the first inverter chain and the second inverter chain comprise sixteen inverters respectively, and each of the inverters of the first inverter chain applies an output from the inverter preceding by an even number of inverters of the first inverter chain as feedback for the purpose of pull-up drive and each of the inverters of the second inverter chain applies an output from the inverter preceding by an even number of inverters of the second inverter chain as feedback for the purpose of pull-down drive.

20. The multi-phase pulse generator as set forth in claim 14, wherein the first inverter chain and the second inverter chain comprise sixteen inverters respectively, and each of the inverters of the first inverter chain applies an output from the inverter preceding by an even number of inverters of the first inverter chain as feedback for the purpose of pull-up drive and each of the inverters of the second inverter chain applies an output from the inverter preceding by an even number of inverters of the second inverter chain with respect to the feedback for pull-up drive of the first inverter chain as feedback for the purpose of pull-down drive.

21. The multi-phase pulse generator as set forth in claim 14, wherein the first inverter chain and the second inverter chain comprise sixteen inverters respectively, and each of the inverters of the first inverter chain applies an output from the inverter preceding by an even number of inverters of the first inverter chain as feedback for the purpose of pull-up drive and each of the inverters of the second inverter chain applies an output from the inverter following by an even number of inverters of the second inverter chain with respect to the feedback for pull-up drive of the first inverter as feedback for the purpose of pull-down drive.

* * * * *